United States Patent
Farnworth et al.

(10) Patent No.: US 11,450,577 B2
(45) Date of Patent: Sep. 20, 2022

(54) METHODS AND SYSTEMS FOR IMAGING AND CUTTING SEMICONDUCTOR WAFERS AND OTHER SEMICONDUCTOR WORKPIECES

(71) Applicant: Micron Technology, Inc., Boise, ID (US)

(72) Inventors: Warren M. Farnworth, Nampa, ID (US); Tom A. Muntifering, Boise, ID (US); Paul J. Clawson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 342 days.

(21) Appl. No.: 15/426,317

(22) Filed: Feb. 7, 2017

(65) Prior Publication Data
US 2017/0148691 A1 May 25, 2017

Related U.S. Application Data

(62) Division of application No. 14/093,682, filed on Dec. 2, 2013, now Pat. No. 9,579,825, which is a division
(Continued)

(51) Int. Cl.
*H01L 21/66* (2006.01)
*H01L 21/78* (2006.01)
(Continued)

(52) U.S. Cl.
CPC .............. *H01L 22/20* (2013.01); *B23K 26/03* (2013.01); *B23K 26/042* (2015.10);
(Continued)

(58) Field of Classification Search
CPC ....... B28D 5/0064; B24B 49/12; H01L 21/78; B23K 26/042; B23Q 15/22
(Continued)

(56) References Cited

U.S. PATENT DOCUMENTS 4,085,329 A 4/1978 McCoy et al.
5,341,024 A 8/1994 Rosotker et al.
(Continued)

FOREIGN PATENT DOCUMENTS

JP 2003297891 10/2003
JP 2005022086 1/2005

OTHER PUBLICATIONS

International Search Report and Written Opinion for International Application No. PCT/US2008/065290, dated Oct. 13, 2008.
(Continued)

*Primary Examiner* — Monica S Carter
*Assistant Examiner* — Marcel T Dion
(74) *Attorney, Agent, or Firm* — Perkins Coie LLP

(57) ABSTRACT

Methods and systems for imaging and cutting semiconductor wafers and other microelectronic device substrates are disclosed herein. In one embodiment, a system for singulating microelectronic devices from a substrate includes an X-ray imaging system having an X-ray source spaced apart from an X-ray detector. The X-ray source can emit a beam of X-rays through the substrate and onto the X-ray detector, and X-ray detector can generate an X-ray image of at least a portion of the substrate. A method in accordance with another embodiment includes detecting spacing information for irregularly spaced dies of a semiconductor workpiece. The method can further include automatically controlling a process for singulating the dies of the semiconductor workpiece, based at least in part on the spacing information. For example, individual dies can be singulated from a workpiece via non-straight line cuts and/or multiple cutter passes.

33 Claims, 10 Drawing Sheets

Related U.S. Application Data of application No. 13/288,442, filed on Nov. 3, 2011, now Pat. No. 8,597,074, which is a division of application No. 11/765,354, filed on Jun. 19, 2007, now Pat. No. 8,053,279.

(51) Int. Cl.

| | | |
|---|---|---|
| *B28D 5/00* | (2006.01) | |
| *B23K 26/40* | (2014.01) | |
| *B23Q 15/22* | (2006.01) | |
| *B26F 3/00* | (2006.01) | |
| *B23K 26/044* | (2014.01) | |
| *B23K 26/03* | (2006.01) | |
| *B23K 26/042* | (2014.01) | |
| *B23K 101/40* | (2006.01) | |
| *B23K 103/00* | (2006.01) | |

(52) U.S. Cl.
CPC ............ *B23K 26/044* (2015.10); *B23K 26/40* (2013.01); *B23Q 15/22* (2013.01); *B26F 3/004* (2013.01); *B28D 5/0064* (2013.01); *H01L 21/78* (2013.01); *B23K 2101/40* (2018.08); *B23K 2103/50* (2018.08); *B23K 2103/56* (2018.08); *Y10T 83/141* (2015.04); *Y10T 83/178* (2015.04); *Y10T 83/538* (2015.04)

(58) Field of Classification Search
USPC .................................................. 438/460–465
See application file for complete search history.

(56) References Cited

U.S. PATENT DOCUMENTS

| | | | | |
|---|---|---|---|---|
| 5,462,636 | A | | 10/1995 | Chen et al. |
| 5,481,109 | A | | 1/1996 | Ninomiya et al. |
| 5,493,095 | A | | 2/1996 | Bruschi et al. |
| 5,739,048 | A | * | 4/1998 | Kerth ....................... B28D 5/00 216/22 |
| 5,786,237 | A | | 7/1998 | Cockerill et al. |
| 6,136,137 | A | | 10/2000 | Farnworth et al. |
| 6,174,788 | B1 | * | 1/2001 | Balamumgan ...... H01L 21/3043 221/209 |
| 6,182,546 | B1 | * | 2/2001 | Hecker ................ B26D 1/0006 83/365 |
| 6,192,289 | B1 | * | 2/2001 | Geffen .................. G06T 7/0004 257/E21.599 |
| 6,494,122 | B2 | * | 12/2002 | Kamigaki ............ B23D 59/001 125/20 |
| 6,498,075 | B1 | * | 12/2002 | Fujimoto ............... B28D 5/023 257/E21.238 |
| 6,521,513 | B1 | * | 2/2003 | Lebens ............... B81C 1/00873 257/620 |
| 6,705,925 | B1 | * | 3/2004 | Cole ....................... B24C 1/045 125/13.01 |
| 6,822,315 | B2 | | 11/2004 | Kelkar et al. |
| 6,969,623 | B1 | | 11/2005 | Ikeda et al. |
| 7,098,077 | B2 | * | 8/2006 | Huang .................... H01L 21/78 257/E21.599 |
| 7,211,370 | B2 | | 5/2007 | Sakaguchi et al. |
| 2002/0086452 | A1 | * | 7/2002 | Kneezel ................. B41J 2/1601 438/21 |
| 2002/0114507 | A1 | * | 8/2002 | Lynch .................. H05K 3/0052 382/151 |
| 2003/0153179 | A1 | | 8/2003 | Kelkar et al. |
| 2004/0018652 | A1 | | 1/2004 | Yeh et al. |
| 2004/0142284 | A1 | | 7/2004 | Sakaguchi et al. |
| 2004/0232524 | A1 | * | 11/2004 | Howard .............. H01L 21/6836 257/620 |
| 2006/0091126 | A1 | * | 5/2006 | Baird .................. B23K 26/0604 219/121.72 |
| 2006/0124611 | A1 | | 6/2006 | Hsu |
| 2006/0189099 | A1 | * | 8/2006 | Lu .......................... H01L 21/78 438/460 |
| 2006/0205280 | A1 | * | 9/2006 | Nishizawa ....... G06K 19/07732 439/630 |
| 2006/0292828 | A1 | | 12/2006 | Chen |
| 2007/0190747 | A1 | * | 8/2007 | Humpston ........... B81C 1/00285 438/460 |
| 2007/0275541 | A1 | | 11/2007 | Harris et al. |
| 2008/0102606 | A1 | | 5/2008 | Sekiya et al. |
| 2009/0075457 | A1 | | 3/2009 | Machida et al. |
| 2009/0148983 | A1 | * | 6/2009 | Scheid ................. B81B 7/0074 438/107 |
| 2010/0129984 | A1 | | 5/2010 | Vakanas et al. |
| 2012/0048085 | A1 | | 3/2012 | Farnworth et al. |
| 2014/0083270 | A1 | | 3/2014 | Farnworth et al. |

OTHER PUBLICATIONS

Office Action dated Jan. 11, 2012 in Taiwan Application No. 097121792, 19 pages.

Office Action dated Jun. 27, 2012 in Taiwan Application No. 097121792, 21 pages.

\* cited by examiner

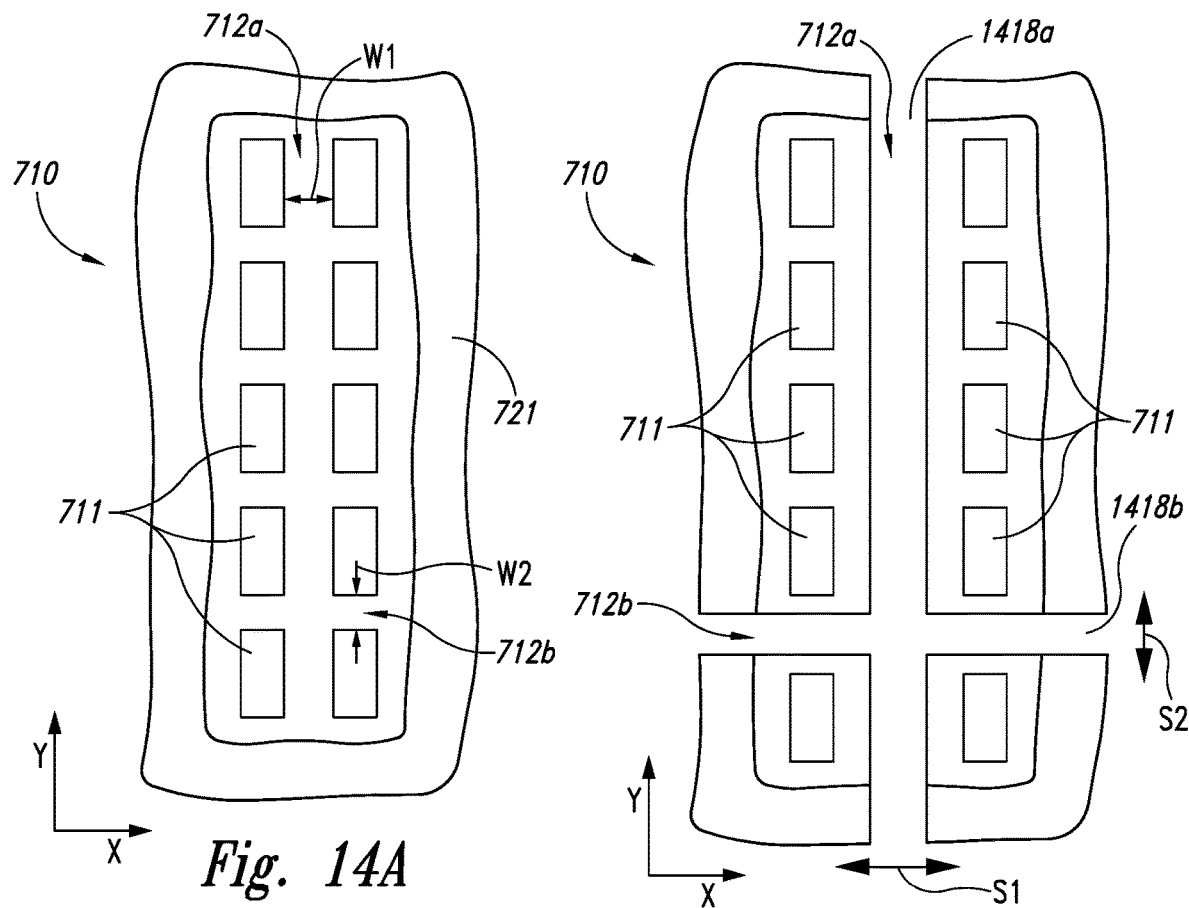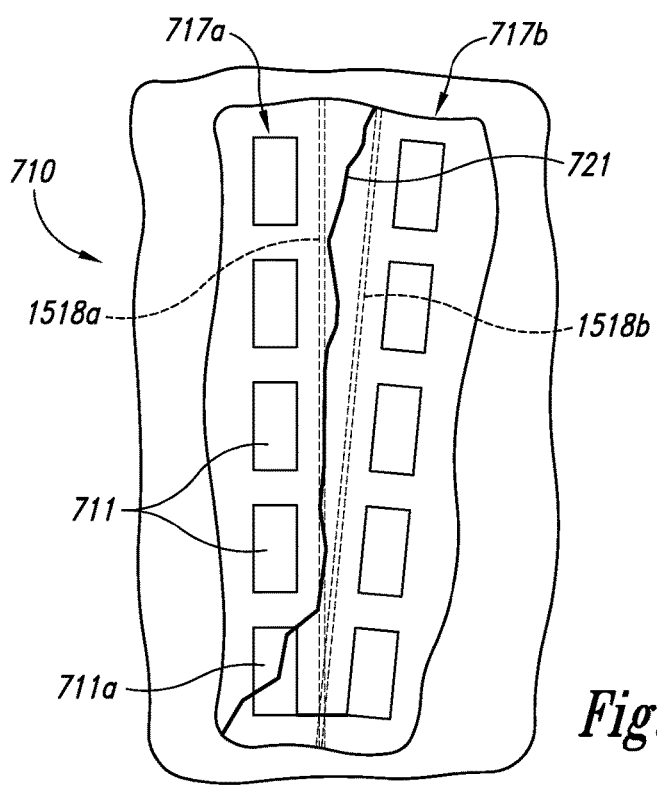

METHODS AND SYSTEMS FOR IMAGING AND CUTTING SEMICONDUCTOR WAFERS AND OTHER SEMICONDUCTOR WORKPIECES

CROSS-REFERENCE TO RELATED APPLICATIONS

This application is a divisional of U.S. application Ser. No. 14/093,682 filed Dec. 2, 2013, which is a divisional of U.S. application Ser. No. 13/288,442 filed Nov. 3, 2011, now U.S. Pat. No. 8,597,074, which is a divisional of U.S. application Ser. No. 11/765,354 filed Jun. 19, 2007, now U.S. Pat. No. 8,053,279, each of which is incorporated herein by reference in its entirety.

TECHNICAL FIELD

The following disclosure relates generally to the manufacture of microelectronic devices and, more particularly, to methods and systems for imaging and cutting semiconductor workpieces.

BACKGROUND

Packaged microelectronic devices are used in cellular phones, pagers, personal digital assistants, computers, and many other electronic products. Die-level packaged microelectronic devices typically include a die, an interposer substrate or leadframe attached to the die, and a molded casing around the die. The die generally has an integrated circuit and a plurality of bond-pads coupled to the integrated circuit. The bond-pads can be coupled to terminals on the interposer substrate or leadframe. The interposer substrate can also include ball-pads coupled to the terminals by conductive traces in a dielectric material. A plurality of solder balls can be attached to corresponding ball-pads to construct a "ball-grid" array. The steps for making die-level packaged microelectronic devices typically include (a) forming a plurality of dies on a semiconductor wafer, (b) cutting the wafer to singulate the dies, (c) attaching individual dies to corresponding interposer substrates, (d) wire-bonding the bond-pads to the terminals of the interposer substrate, and (e) encapsulating the dies with a molding compound.

Another process for packaging microelectronic devices is wafer-level packaging. In wafer-level packaging, a plurality of microelectronic dies are formed on a wafer and a redistribution layer is formed over the dies. The redistribution layer includes a dielectric layer, a plurality of ball-pad arrays on the dielectric layer, and a plurality of traces coupled to individual ball-pads of the ball-pad arrays. Each ball-pad array is arranged over a corresponding microelectronic die, and the traces couple the ball-pads in each array to corresponding bond-pads on the die. After forming the redistribution layer on the wafer, a stenciling machine can deposit discrete blocks of solder paste onto the ball-pads of the redistribution layer. The solder paste is then reflowed to form solder balls or solder bumps on the ball-pads. After forming the solder balls on the ball-pads, the wafer is cut to singulate the dies.

Another type of packaged microelectronic device is a build-up package ("BUP") microelectronic device. BUP devices are formed by placing multiple singulated microelectronic dies active side down on a temporary carrier. A fill material is then used to cover the dies and the carrier. Once the fill material cures, the temporary carrier is removed. The active sides of the dies are cleaned, and then a redistribution layer is applied to the active sides. Solder balls can be connected to the redistribution layer, and a dielectric layer can be applied over portions of the redistribution layer so that the solder balls extend through the dielectric layer. The fill material between the dies is then cut to separate the dies from one another and form multiple BUP devices. The solder balls and redistribution layer can then be used to connect the BUP device to a printed circuit board.

BUP devices can also be formed by placing multiple singulated dies active side down on a temporary carrier, and placing fill material between the dies. Once the fill material hardens, the temporary carrier is removed and the BUP devices are separated by cutting the fill material between the dies. It may be difficult to place a redistribution layer on the active sides of the dies with this process, however, because the active sides and the fill material may not form a sufficiently planar surface for effective application of a redistribution layer, and the dies may be skewed such that precise wafer level processes cannot be used.

Whether the dies are encapsulated before or after dicing, the dies are generally organized in a rectilinear array of rows and columns that are separated by streets. The rows and columns are spaced apart from each other in a repeated pattern, generally with a fixed row spacing between neighboring rows, and a fixed column spacing between neighboring columns. The pattern is generally fixed for a given type of wafer and die configuration. Accordingly, even if a particular type of wafer has dies of different sizes, the dies are arranged in a predictable pattern that is repeated from one wafer to the next.

Prior to dicing, a camera or other type of imaging system is used to detect the rotational orientation of the array and the starting point at which the dicing process begins. A dicing blade is then brought into contact with the wafer and either the blade or the wafer is translated to make the first cut (e.g., along a column). The blade or the wafer is then stepped over to the next column by a known distance corresponding to the spacing between columns, and the next cut is made. This process is repeated until all the necessary column cuts are completed. At that point, the wafer (or the blade) is rotated 90° and the same process is repeated until all the row cuts are complete.

While the foregoing process has proven effective for many applications, in certain applications, the spacing between dies may not be consistent from one wafer to the next, or within a given wafer. In such a case, the rotating blade typically cannot account for spacing variations and as a result, may cut through dies that would otherwise be suitable for installation in an end product. Accordingly, there is a desire to improve the versatility of current singulation processes.

FIG. 1 is a schematic diagram of a prior art system 100 for imaging a semiconductor wafer 102 ("wafer 102") and cutting the wafer 102 into individual dies. The system 100 includes an infrared camera 110 having an infrared detector array (not shown). The infrared camera 110 is operably coupled to a dicing machine 114 via a computer 112. The dicing machine 114 can include a saw having, for example, a diamond-tipped blade 116 that rotates about a spindle to cut through the wafer 102. The wafer 102 is supported by a chuck 104 that is operably coupled to a heat source 106. To facilitate cutting and/or imaging, the chuck 104 is able to move laterally in an X direction and rotate about its axis in a θ direction. Similarly, the dicing machine 114 is able to move up and down in a Y direction as well as back and forth in a Z direction.

In operation, the heat source 106 heats the wafer 102 to a predetermined temperature, causing the wafer 102 to generate infrared photons or "flux." The detector array in the infrared camera 110 creates a map of the wafer 102 based on the flux intensity received by each of the individual detectors in the array. The computer 112 converts the flux detected by each of the detectors into a temperature reading corresponding to a feature on the wafer 102. This enables the computer 112 to determine the location of scribe lines and/or other alignment features (i.e., fiducials) on the wafer 102. The computer 112 provides this information to the dicing machine 114, which then cuts the wafer 102 along the scribe lines to singulate the individual dies.

Another type of infrared imaging system commonly used to align semiconductor wafers does not use a heat source to heat the wafer. This type of system is a reflective system that directs infrared radiation down onto the wafer, and then captures the infrared radiation that reflects off of the wafer with a camera that generates an image of the wafer.

Many semiconductor wafers include layers of material that can inhibit infrared imaging. For example, various types of memory and imaging semiconductor devices include metallized layers on the back side to enhance protection from electromagnetic interference (EMI). These metallized layers can obscure infrared radiation, making accurate infrared imaging difficult, if not impossible. In addition, when cutting BUP devices, the mold material can also obscure infrared imaging, again making it difficult to accurately detect the location of scribe lines and other alignment features. To overcome these problems, semiconductor wafers can be manufactured so that the metallized layer or mold compound is prevented from covering the alignment features. Alternatively, the infrared inhibiting material can be removed from around the alignment features prior to wafer imaging. Both of these approaches, however, are time consuming and can reduce the amount of space on a wafer available for producing dies. Therefore, it would be desirable to have a system for imaging and cutting semiconductor wafers that have infrared inhibiting layers obscuring alignment features.

BRIEF DESCRIPTION OF THE DRAWINGS

FIGS. 14A and 14B illustrate portions of a semiconductor workpiece that may move relative to each other during a dicing operation in accordance with an embodiment of the invention.

FIG. 15 illustrates a cracked semiconductor workpiece, along with dicing cuts made in accordance with an embodiment of the invention.

DETAILED DESCRIPTION

Figure 1:
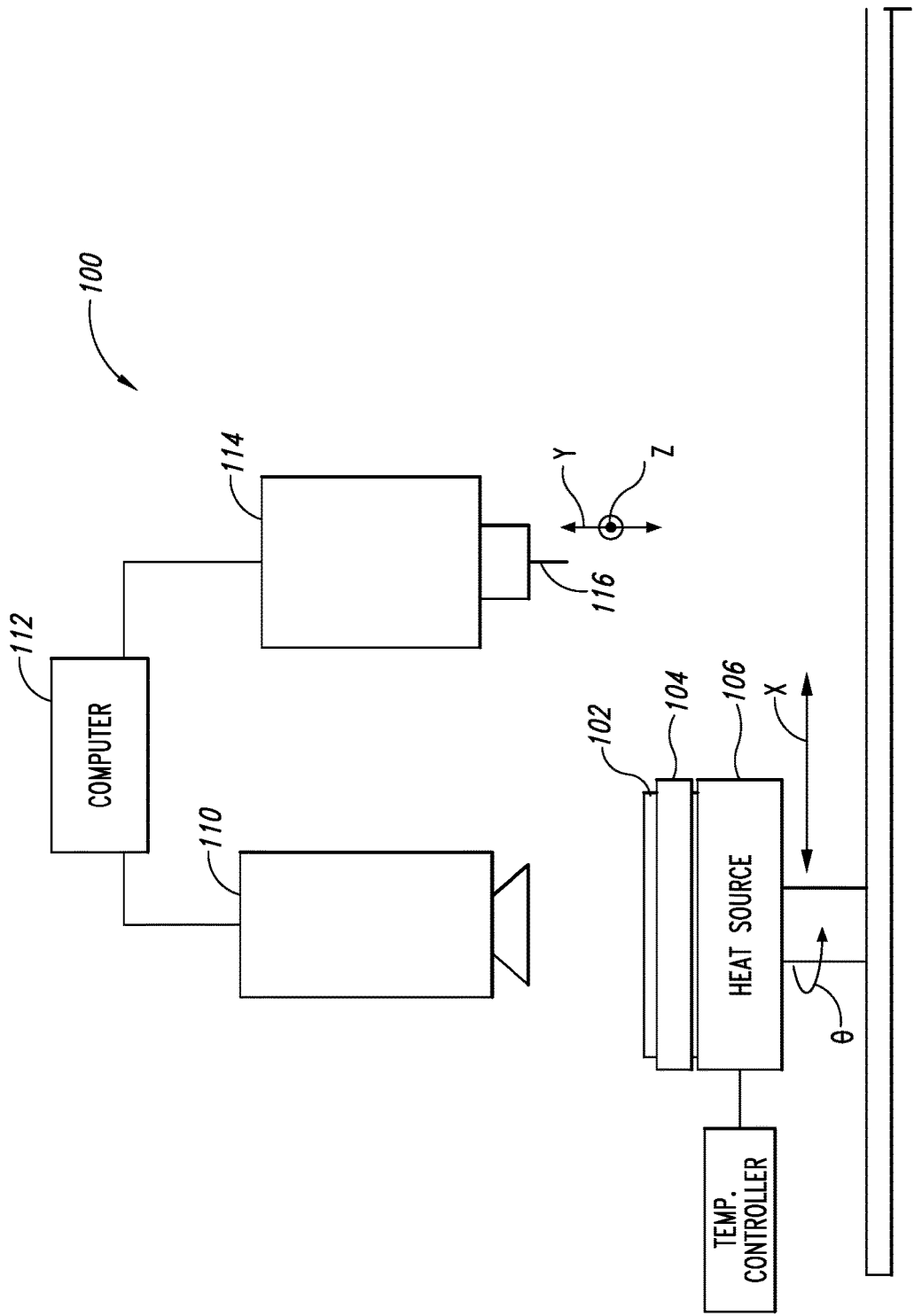
FIG. 1 is a schematic diagram of a prior art semiconductor imaging and cutting system.

The following disclosure describes methods and systems for imaging and dicing semiconductor wafers and other microelectronic device substrates. Specific details of several embodiments of the disclosure are described below with reference to semiconductor workpieces ("workpieces") and systems for processing the workpieces. The workpieces can include micromechanical components, data storage elements, optics, read/write components and/or other features. For example, the workpieces can include wafers having dies, including SRAM, DRAM (e.g., DDR-SDRAM), flash-memory (e.g., NAND flash-memory), processor, imager, and/or other dies. Substrates can be semiconductive pieces (e.g., doped silicon wafers, gallium arsenide wafers, or other semiconductor wafers), non-conductive pieces (e.g., various ceramic substrates), or conductive pieces. Several other embodiments of the invention can have configurations, components, or procedures different than those described in this section. A person of ordinary skill in the art, therefore, will accordingly understand that the invention may have other embodiments with additional elements, or the invention may have other embodiments without several of the elements shown and described below with reference to FIGS. 2-15.

Many specific details of certain embodiments of the invention are set forth in the following description and in FIGS. 2-15 to provide a thorough understanding of these embodiments. A person skilled in the art, however, will understand that the invention may be practiced without several of the details described below, or with additional details which can be added to the invention. Well-known structures and functions often associated with semiconductor wafers, associated imaging and cutting systems, and microelectronic devices in general have not been shown or described in detail to avoid unnecessarily obscuring the description of the various embodiments of the invention. Where the context permits, singular or plural terms may also include plural or singular terms, respectively. Moreover, unless the word "or" is expressly limited to mean only a single item exclusive from the other items in reference to a list of two or more items, then the use of "or" in such a list means including (a) any single item in the list, (b) all of the items in the list, or (c) any combination of the items in the list. Additionally, the term "comprising" is used throughout the following disclosure to mean including at least the recited feature(s) such that any greater number of the same feature and/or additional types of features or components is not precluded.

While various aspects of the invention are described below in the context of semiconductor wafers, those of ordinary skill in the art will understand that the methods and systems described herein can also be used to singulate dies and/or other microelectronic devices from other types of substrates. For example, the various methods and systems described herein can also be used to separate individual dies from a BUP substrate.

A particular method for singulating semiconductor dies includes detecting spacing information for irregularly spaced dies of an individual semiconductor workpiece, and, based at least in part on the spacing information, automatically controlling a process for singulating the dies of the individual semiconductor workpiece. In further particular arrangements, the method can include directing a cutter (e.g., a laser beam or water jet) to deviate from a single straight line path as it traverses a semiconductor workpiece. Further details of these and other methods and associated systems are discussed below.

Figure 2:
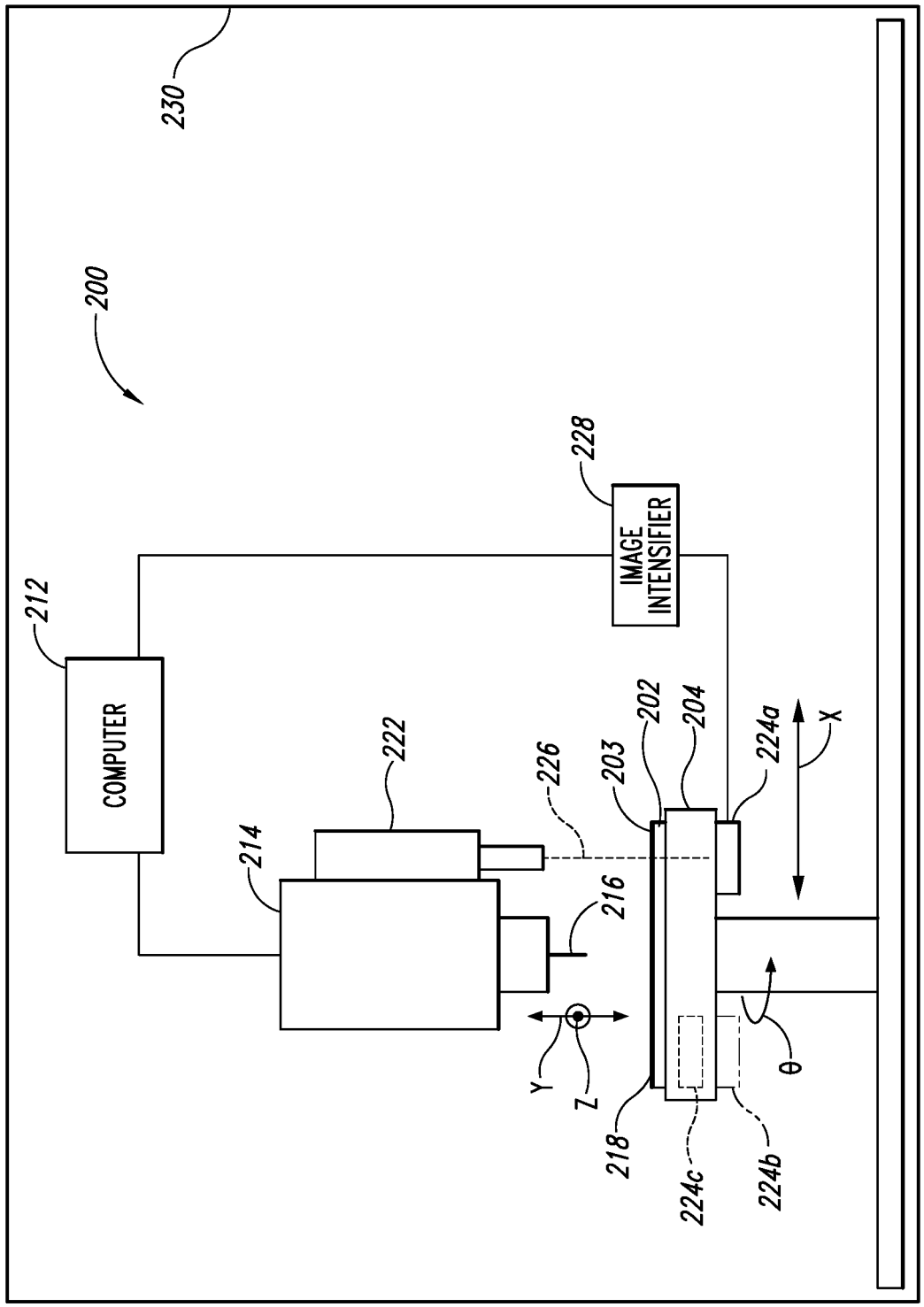
FIG. 2 is a schematic illustration of a semiconductor wafer imaging and cutting system in accordance with an embodiment of the invention.

FIG. 2 is a schematic illustration of a semiconductor wafer imaging and cutting system 200 ("cutting system 200") in accordance with an embodiment of the invention. As described in greater detail below, the cutting system 200 includes an X-ray imaging system (e.g., a fluoroscopic X-ray imaging system) for aligning a semiconductor wafer 202 ("wafer 202") for dicing. The wafer 202 can include various types of microelectronic devices (e.g., DRAM, SRAM, Flash, Imagers, PCRAM, MRAM, etc.) which are not shown in FIG. 2. The wafer 202 can also include an infrared inhibiting layer 203 applied to a backside 218. The infrared inhibiting layer 203 extends over all or a portion of the backside 218 such that it covers all, or at least a substantial portion, of the wafer alignment features (not shown in FIG. 2). The infrared inhibiting layer 203 can include a metal layer (e.g., an aluminum, copper, tungsten, nickel layer, etc.) to reduce electromagnetic interference (EMI), shield against infrared radiation and/or for other purposes. The infrared inhibiting layer 203 can also include quartz, mold compound, and/or other compounds and materials known in the art that obscure infrared imaging of wafer alignment features.

The wafer 202 is carried by a wafer holder 204 (e.g., a chuck, such as a vacuum chuck). To facilitate imaging and/or cutting, the wafer holder 204 can rotate in a θ direction and move laterally in an X direction. In other embodiments, the wafer holder 204 can also move up and down in a Y direction or back and forth in a Z direction.

The cutting system 200 further includes a low intensity X-ray emitter or source 222 operably mounted to a dicing machine 214. The X-ray source 222 projects an X-ray beam 226 through the wafer 202 and onto a detector 224a (e.g., a detector screen, such as a flat panel detector screen, a fluorescent screen, a Cesium iodide (CsL) screen, etc.). Although the detector 224a is positioned proximate to a lower portion of the wafer holder 204 in the illustrated embodiment, in other embodiments, the cutting system 200 can include other detector screens in other positions beneath the wafer 202. For example, the cutting system 200 can include a second detector screen 224b on an opposite side of the wafer holder 204, and/or a third detector screen 224c which is incorporated into the wafer holder 204. The cutting system 200 can be positioned within a shielded enclosure 230 to contain the X-ray radiation from the X-ray source 222.

The detector 224a provides wafer image information to a signal processor or computer 212. The detector 224a can optionally be coupled to an image intensifier 228 that intensifies the wafer image before transmitting the image information to the computer 212. As described in greater detail below, the wafer image information is processed by the computer 212 to determine the relative locations of alignment features on the wafer 202. This information is then converted into instructions for controlling the dicing machine 214 during cutting of the semiconductor wafer 202.

The dicing machine 214 can include a cutter device 216 for cutting the semiconductor wafer 202 and/or singulating the dies and/or other microelectronic devices on the wafer. In the illustrated embodiment, the cutter device 216 can include a saw having, for example, a diamond-tipped blade. In other embodiments, the cutter device 216 can include a water-jet cutting device, a laser cutting device, and/or other suitable wafer cutting devices known in the art.

Figure 3:
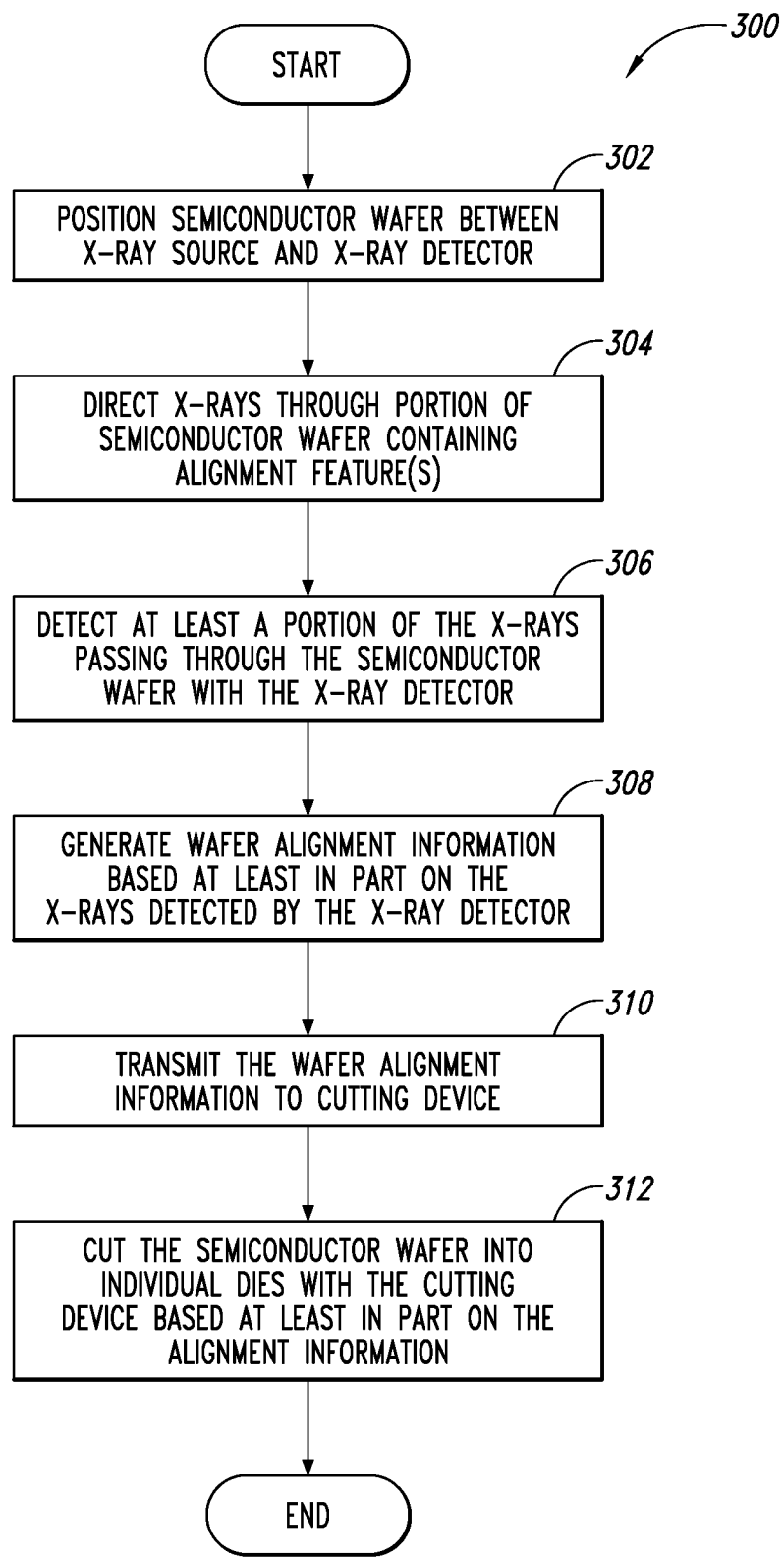
FIG. 3 is a flow diagram illustrating a method for imaging and dicing a semiconductor wafer in accordance with an embodiment of the invention.

FIG. 3 is a flow diagram illustrating a method 300 of imaging and dicing a semiconductor wafer or other microelectronic device substrate in accordance with an embodiment of the invention. For purposes of illustration, the method 300 is described below with reference to the cutting system 200 of FIG. 2. In block 302, the wafer 202 is positioned on the wafer holder 204 between the X-ray source 222 and the detector 224a. In block 304, the X-ray source 222 emits the X-ray beam 226 through the wafer 202 and the infrared inhibiting layer 203. The X-ray source 222 and/or the wafer holder 204 can be moved as necessary to at least generally align the X-ray beam 226 with an alignment feature (not shown in FIG. 2, but described in detail below with reference to FIG. 5) in the wafer 202. In block 306, the detector 224a detects at least a portion of the X-rays passing through the wafer 202. X-ray image information is then transmitted from the detector 224a to the computer 212. In block 308, the computer 212 generates wafer alignment information based at least in part on the X-ray image information received from the detector 224a. In block 310, the computer 212 transmits the wafer alignment information (in, e.g., the form of cutting instructions) to the dicing machine 214. In block 312, the dicing machine 214 operates the cutter device 216 to singulate the dies on the wafer 202. After block 312, the routine ends.

Figure 4:
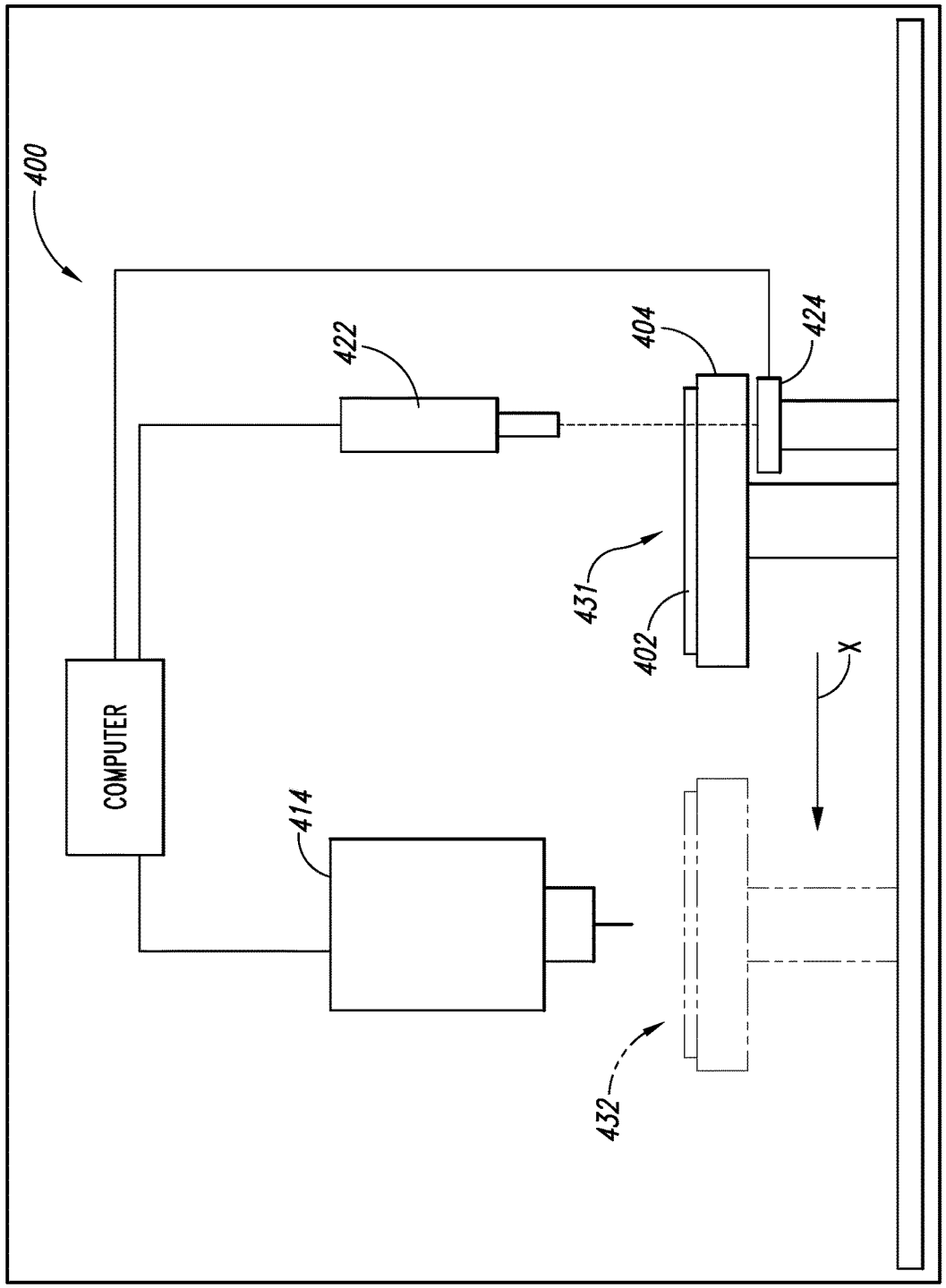
FIG. 4 is a schematic illustration of a semiconductor wafer imaging and cutting system in accordance with another embodiment of the invention.

FIG. 4 is a schematic illustration of a semiconductor imaging and cutting system 400 ("cutting system 400") in accordance with another embodiment of the invention. Many features of the cutting system 400 are at least generally similar in structure and function to the corresponding features of the cutting system 200 described above with reference to FIGS. 2 and 3. For example, the cutting system 400 includes a movable wafer holder 404 that supports a semiconductor wafer 402. In this particular embodiment, however, the cutting system 400 further includes an X-ray source 422 that is spaced apart from a dicing machine 414.

To use the cutting system 400, the wafer holder 404 starts in a first position 431 so that a detector screen 424 can obtain an X-ray image of the wafer 402. In the illustrated embodiment, the detector screen 424 is mounted independently of the wafer holder 404 in alignment with the X-ray source 422. In other embodiments, the detector screen 424 can be attached or otherwise incorporated into the wafer holder 404 as described above with reference to FIG. 2. After the wafer 402 has been suitably imaged in the first position 431, the wafer holder 404 moves to a second position 432 proximate to the dicing machine 414. The dicing machine 414 then cuts the wafer 402 based at least in part on the X-ray image information received from the detector screen 424.

Figure 5:
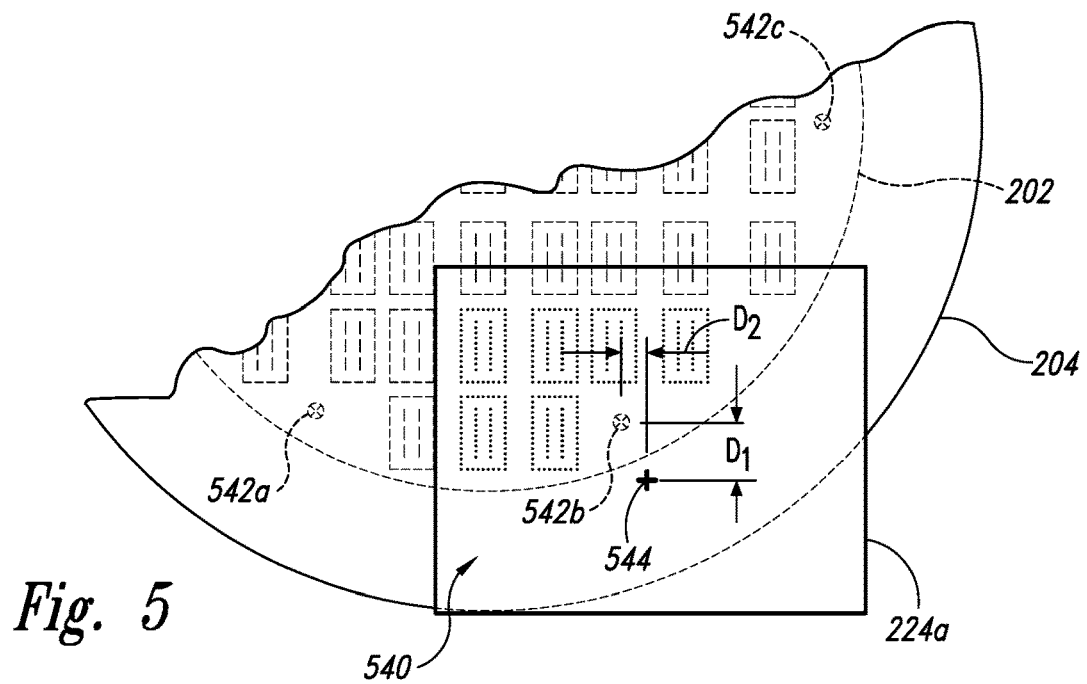
FIG. 5 is a schematic diagram of a wafer X-ray image in accordance with an embodiment of the invention.

FIG. 5 is a schematic diagram illustrating an X-ray image 540 of the semiconductor wafer 202 captured by the detector 224a in accordance with an embodiment of the invention. In this embodiment, the semiconductor wafer 202 includes a plurality of fiducials or alignment features 542 (identified individually as a first alignment feature 542a, a second alignment feature 542b, and a third alignment feature 542c). The alignment features 542 can include metals and/or other materials that are X-ray opaque, and thus can be identified by X-ray imaging.

To align the semiconductor wafer 202 for cutting, the X-ray image 540 is taken of a portion of the semiconductor wafer 202 that includes, for example, the second alignment feature 542b. X-ray image data from the detector 224a is then transmitted to the computer 212 (FIG. 2) so that any offset of the second alignment feature 542b (shown by a first distance D1 and a second distance D2) relative to a known datum 544 can be determined. In one embodiment, the known datum 544 can represent the position the second alignment feature 542b would be in if the semiconductor wafer 202 was properly aligned with the dicing machine 214. Once the extent of any offset is known, the computer 212 can adjust the position of the dicing machine 214 as necessary to account for any misalignment of the semiconductor wafer 202. In certain embodiments, it may be desirable to determine the position of two or more of the alignment features 542 in the foregoing manner to enhance the level of wafer alignment prior to dicing.

Figure 6:
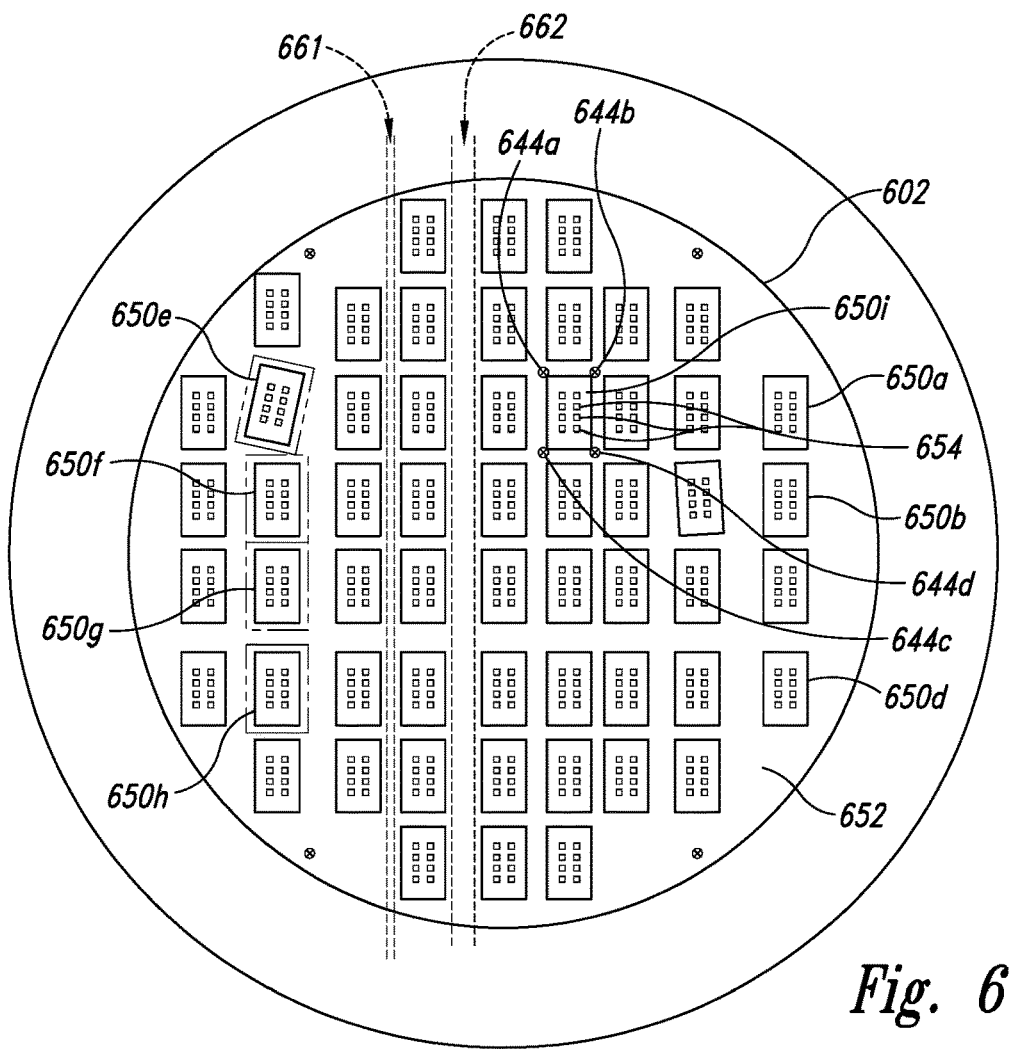
FIG. 6 is a schematic diagram of a microelectronic device substrate that includes a plurality of variable-pitch microelectronic devices in accordance with an embodiment of the invention.

FIG. 6 is a schematic diagram of a microelectronic device substrate 602 having a plurality of variable-pitch microelectronic devices 650 (identified individually as microelectronic devices 650a-i) in accordance with another embodiment of the invention. The microelectronic devices 650 can include, for example, BUP devices held together in the substrate 602 by a fill material (e.g., mold compound) 652. As is often the case with BUP device substrates, the spacing between the devices 650 can vary. As a result, cutter street widths (or "kerfs") can vary from a relatively narrow street width 661 to a relatively wide street width 662. Furthermore, one or more of the individual devices 650 may also be skewed relative to the other microelectronic devices, as illustrated by the microelectronic device 650e. When singulating the microelectronic devices 650 from the substrate 602, however, it is desirable to have the same amount of mold compound surrounding each of the individual devices 650 following the singulation process, as illustrated by the phantom lines extending around the microelectronic devices 650e-650h.

Because some of the microelectronic devices 650 (e.g., the microelectronic device 650e) may be skewed, a rotary saw blade may not be able to negotiate the cutting path between two or more of the devices. To address this problem, various embodiments of the invention can include a laser-based or high pressure water-based cutting device to cut around the individual microelectronic devices 650 and separate them from the substrate 602. (If a water jet cutting device is used to cut around the individual microelectronic devices 650, then each of the devices 650 may need to be individually supported in a manner known in the art.) Some cutting devices (e.g., saws) have to make two or more passes on a given street to achieve the desired street width and/or provide the desired package size. However, if a laser cutting device is used, the spot size of the laser could be dynamically adjusted to vary the thickness of the cutting path. Similarly, if a water jet cutting device is used, the jet stream diameter could be dynamically adjusted to provide the desired cutting path width.

In one embodiment, the X-ray imaging and cutting system 200 described above with reference to FIGS. 2-5 can be used to singulate the individual microelectronic devices 650 from the substrate 602 and leave a relatively even amount of mold material or "edge distance" around each of the devices. In this embodiment, the cutting device 216 can include either a laser cutting device or a water jet cutting device that is able to cut around the periphery of each of the individual devices 650. To singulate, for example, the microelectronic device 650i, the cutting system 200 takes a real-time X-ray image of alignment features 644a-d to determine the actual location of the device 650i before instructing the dicing machine 214 to cut around the device. In another embodiment, the cutting system 200 can take an X-ray image that locates the edges of the device 650i, and then instruct the dicing machine 214 to cut around the device. In a further embodiment, the cutting system 200 can use X-ray information relating to the location of one or more contacts 654 (e.g., bond-pads, solder balls, etc.) on the device 650i.

While the use of an X-ray imaging system may be necessary in those cases where the semiconductor wafer or other microelectronic device substrate includes a metal layer, the method disclosed herein of using laser-based or water jet-based cutting devices to cut around variable pitch microelectronic devices is not limited to use with X-ray imaging systems. Indeed, the cutting techniques disclosed herein can be employed with many other types of alignment systems (e.g., visual, infrared, etc.) as long as the particular alignment system is able to locate the periphery of the individual microelectronic devices.

Figure 7:
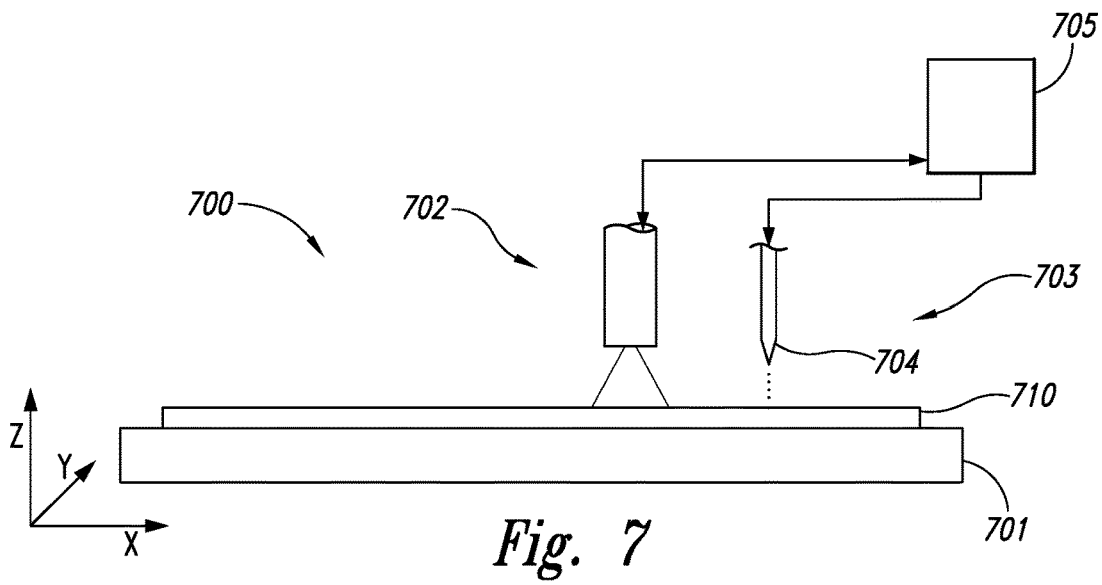
FIG. 7 is a schematic block diagram of an apparatus for singulating semiconductor workpieces in accordance with an embodiment of the invention.

FIG. 7 is a schematic block diagram of an apparatus 700 for singulating a semiconductor workpiece 710 in accordance with several embodiments of the invention. The apparatus 700 can include a support 701 that carries the semiconductor workpiece 710 during one or more operations, a detection device 702 that detects characteristics of the semiconductor workpiece 710, a singulation device 703 that singulates dies from the semiconductor workpiece 710, and a controller 705 that directs the operation of the foregoing components. The detection device 702, the singulation device 703, and/or the support 701 can translate relative to each other along x, y, and/or z axes, and can also rotate (e.g., about the z axis) to position any of the components relative to the other. Characteristics of these components are described generally below, and associated methods and techniques are then described in further detail with reference to FIGS. 8-15.

The detection device 702 can be configured and positioned to detect selected characteristics of the semiconductor workpiece 710, including but not limited to information corresponding to the spacings between individual dies or groups of dies of the semiconductor workpiece 710. Accordingly, the detection device 702 can include a vision system, for example, a still camera or a motion camera. In a particular embodiment, the detection device 702 includes a camera that detects radiation in the visible spectrum, and in other embodiments, the detection device 702 can detect radiation at other wavelengths, for example, infrared radiation or X-ray radiation. Representative embodiments of such detection devices were described above with reference to FIGS. 2-4. In any of these embodiments, the apparatus 700 can include an appropriate illumination system which may or may not be incorporated into the detection device 702. For example, if the detection device 702 includes a visible wavelength camera, the apparatus 700 can include a visible wavelength illumination device. If the detection device 702 includes an X-ray camera, the apparatus 700 can include an appropriately positioned X-ray radiation source. In other embodiments, the detection device 702 can obtain information using other types of energy, for example, ultrasonic energy.

In any of the foregoing embodiments, the controller 705 controls the activation of the detection device 702, and optionally, the relative motion between the detection device 702 and the support 701. The detection device 702 and the support 701 may move relative to each other to allow the detection device 702 to obtain information over the entirety of the semiconductor workpiece 710, and/or to allow the detection device 702 to provide detailed information for particular portions of the workpiece 710. This function can also be provided by equipping the detection device 702 with a zoom feature. The support 701 can also move relative to the detection device 702 during the singulation process, which is described below.

Based at least in part on the information received from the detection device 702, the controller 705 controls the operation of the singulation device 703 so as to singulate dies from the semiconductor workpiece 710 in a manner that accounts for spacing (and/or other) information specific to the particular semiconductor workpiece 710 presently at the apparatus 700. Accordingly, the controller 705 can include a computer readable medium containing instructions (e.g., programmed instructions) that reduce or otherwise handle the data obtained from the detection device 702, and direct the singulation device 703 accordingly. The singulation device 703 can include a cutter 704 positioned proximate to the workpiece support 701 for singulating dies from the semiconductor workpiece 710. In particular embodiments, the cutter 704 can include a laser (e.g., a hot laser or another type of laser), a liquid or gaseous jet (e.g., an abrasive or non-abrasive water jet) and/or other devices. In many arrangements, the cutter 704 does not include a rotary blade, so as to enable the cutter 704 to readily and precisely adjust the cutting path to account for irregular spacings between dies of the semiconductor workpiece 710. However, in at least some arrangements, the cutter 704 can include a rotary blade, for example, in situations in which the straight line cuts made by such blades may be oriented to account for the irregularities in die spacing. Further details of such arrangements will be described later with reference to FIGS. 11-15.

The apparatus 700 shown in FIG. 7 illustrates a detection device 702 and a singulation device 703 that operate on the semiconductor workpiece 710 while it is at a single station. This arrangement can reduce the need for repositioning the workpiece 710 after the characteristics of the workpiece 710 have been detected and before the workpiece 710 is singulated in accordance with the detected characteristics. Such an arrangement can reduce the likelihood that the workpiece 710 will become misaligned between the detection operation and the singulation operation. However, in other embodiments, for example, when the alignment of the workpiece 710 can be precisely controlled or accounted for when the workpiece 710 is moved, the detection device 702 and the singulation device 703 can be located at different stations.

Figure 8:
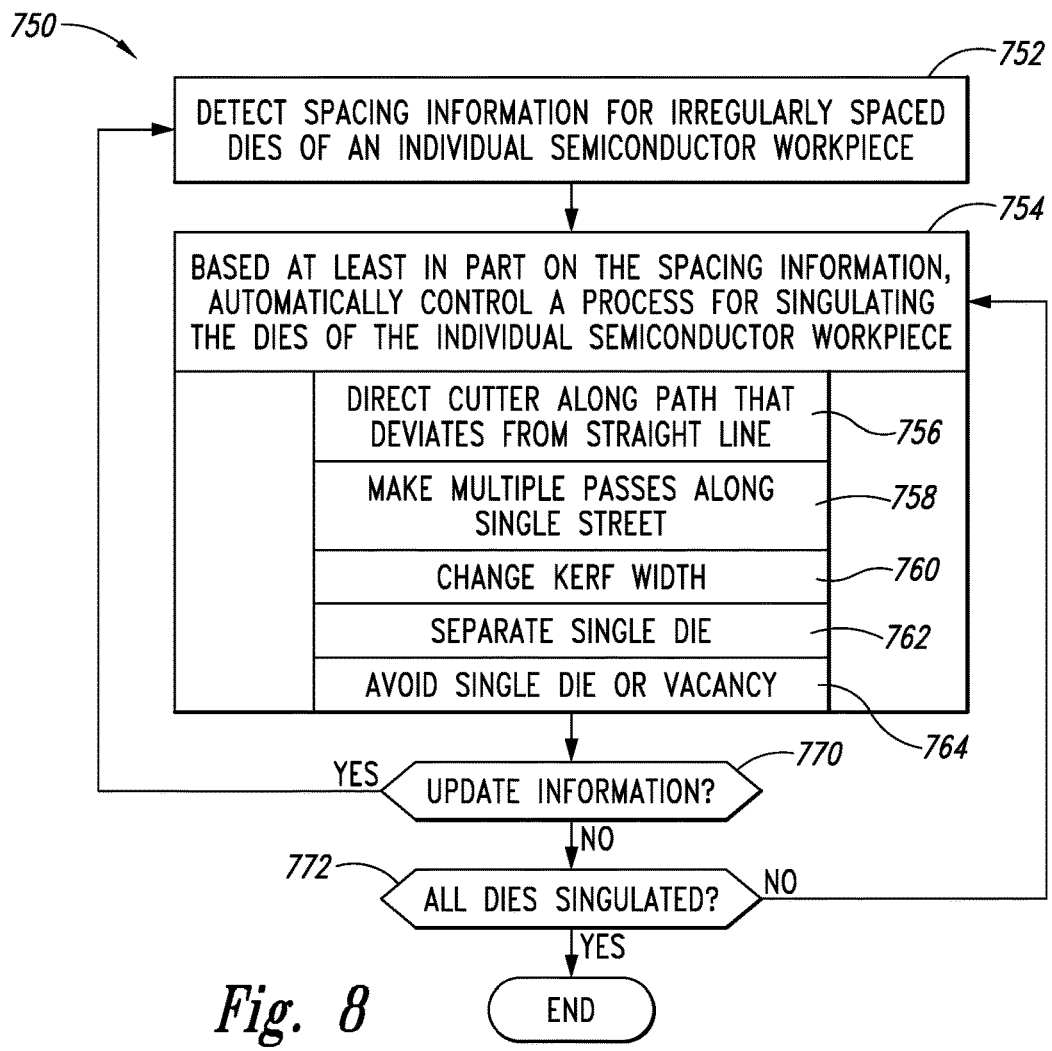
FIG. 8 is a flow diagram illustrating a process for singulating dies of a semiconductor workpiece in accordance with an embodiment of the invention.

FIG. 8 illustrates a representative process 750 for singulating dies from a semiconductor workpiece 710 in accordance with several embodiments of the invention. The process 750 can include detecting spacing information for irregularly spaced dies of an individual semiconductor workpiece (process portion 752). Based at least in part on the spacing information, the process 750 can further include automatically controlling a process for singulating the dies of the individual semiconductor workpiece (process portion 754). The dies can be singulated using one or more of several techniques to account for the irregular spacing of the dies. For purposes of illustration, several different techniques are shown together in FIG. 8, but it will be understood by one of ordinary skill in the relevant art that any one technique or any combination of techniques may be used for a given workpiece. These techniques include, but are not limited to, directing a cutter along a path that deviates from a straight line (process portion 756). Process portion 758 includes making multiple passes along a single street positioned between rows or columns of dies. In process portion 760, the width of a kerf made by the cutter can be changed. In other processes, individual dies can be separated from the workpiece (process portion 762), and in still further processes, individual dies can be avoided, for example, if such dies are inoperable or defective (process portion 764). Specific locations of the workpiece (e.g., vacancies of the workpiece where no die exists) can also be avoided with this technique.

In process portion 770, it is determined whether or not to update the spacing information obtained in process portion 752. For example, in some instances, making a cut between dies of the workpiece can cause the dies to shift, changing the relative spacing between such dies. In such cases, it may be desirable to update the spacing information, and so process portion 752 is repeated. If the information need not be updated, then in process portion 772 it is determined whether all the dies targeted for singulation have been singulated. If they have not, the process returns to process portion 754. If they have, the process ends.

Figure 9:
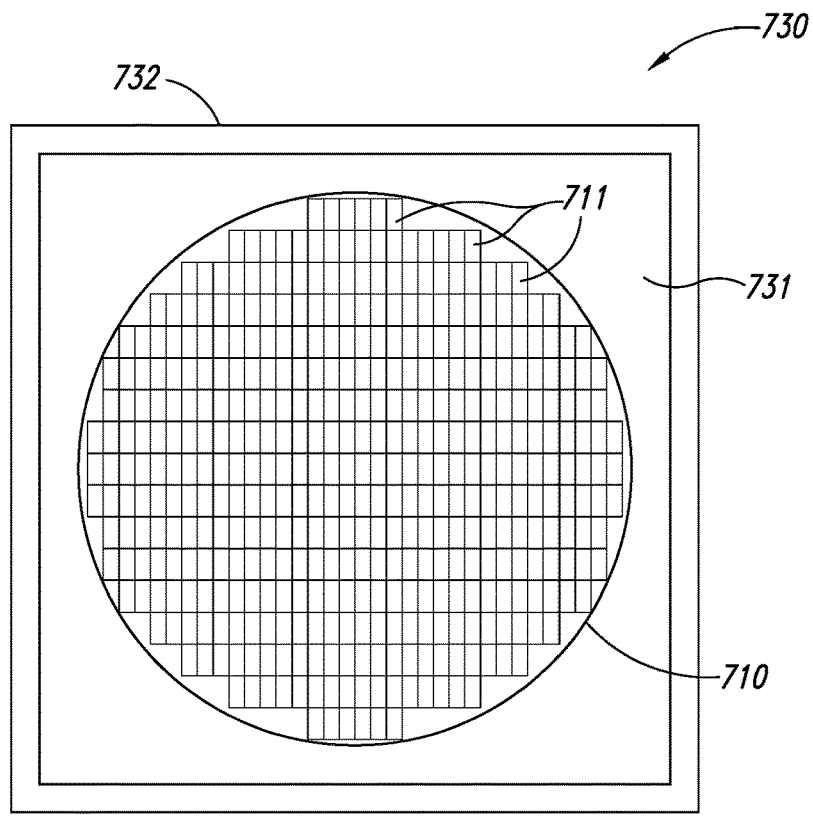
FIG. 9 is a schematic plan view of a semiconductor workpiece having dies positioned in accordance with an embodiment of the invention.

FIG. 9 is a schematic plan view of the workpiece 710 prior to undergoing a singulation operation in accordance with an embodiment of the invention. The workpiece 710 can include a wafer or other collection of dies 711 that are to be singulated. For example, the workpiece 710 can include a collection of dies that have already been singulated from a wafer, then repositioned or repopulated on a substrate, and then encapsulated. The workpiece 710 is generally supported on a film frame 730. The film frame 730 includes a frame 732 carrying a film 731, which in turn is adhesively attached to the semiconductor workpiece 710 to support the workpiece 710 during the singulation operation. Typically, the same film frame 730 also supports the semiconductor workpiece 710 during the detection operation so that the semiconductor workpiece 710 retains the same orientation relative to the film frame 730 during both the detection operation and the singulation operation. In other embodiments, this need not be the case, and in still further embodiments, the workpiece 710 can be supported by devices other than the film frame 730, or the workpiece 710 can be unsupported.

Figure 10:
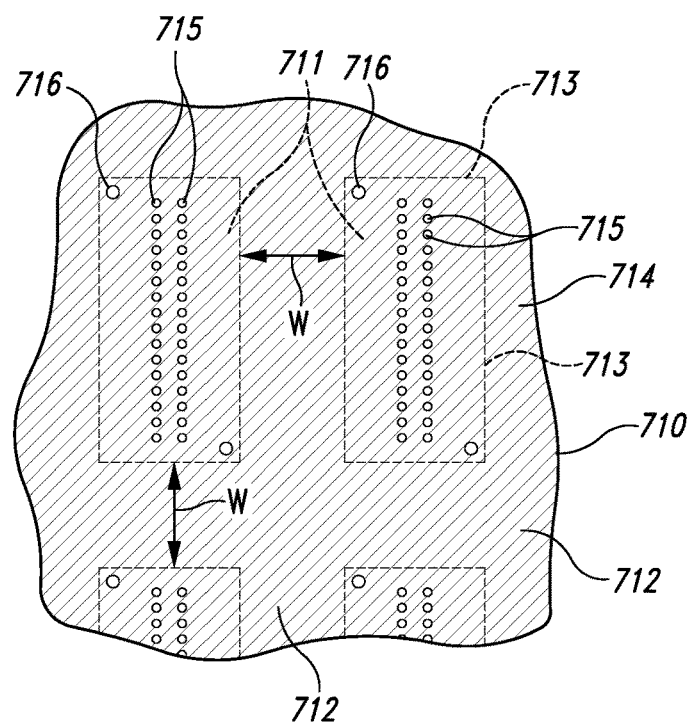
FIG. 10 is an enlarged plan view illustrating a portion of the semiconductor workpiece shown in FIG. 9.

FIG. 10 is a plan view of a portion of a representative workpiece 710 having spaced apart dies 711. The illustrated workpiece 710 is covered with an encapsulant 714, though in other cases, the workpiece 710 is not encapsulated. Each of the dies 711 includes die edges 713 which are shown in dashed lines in FIG. 10 as result of the overlying encapsulant 714. The dies 711 can also include conductive couplers 715, for example, solder balls that project through the encapsulant 714. In other embodiments, the conductive couplers 715 can include other structures (e.g., solder bumps, bumps made from other conductive materials, or wire bonds). In many cases, the conductive couplers 715 and/or the die edges 713 can be detected by the detector 702 (FIG. 7) and can provide enough information to enable the dies 711 to be accurately singulated, despite being irregularly spaced. For example, if the workpiece 710 is encapsulated, the detection device 702 can detect the location and orientation of individual dies 711 by detecting the conductive couplers 715 using visible light. Alternatively, the detection device 702 can detect the die edges 713 using X-ray radiation or another radiation to which the encapsulant 714 is transparent. If the workpiece 710 has no encapsulant 714, then the detection device 702 can use visible light to detect the die edges 713.

In some cases, the dies 711 may have other features which are specifically included to provide spacing information. For example, the dies 711 can include fiducials 716 that extend through the encapsulant 714. For purposes of illustration, two fiducials 716 are shown for each die in FIG. 10, but it will be understood that in other embodiments, a single fiducial 716 or more than two fiducials 716 may be used to provide a basis for the detected spacing information. The fiducials 716 (or other features) may be used in addition to or in lieu of the conductive couplers 715 and/or the die edges 713 to provide spacing information.

In any of the foregoing embodiments, neighboring dies 711 and neighboring groups of dies 711 are separated by streets 712. Each street has a street width W. In general, the streets W are of uniform width and spacing, or otherwise follow a uniform pattern. However, as will be discussed in greater detail below with reference to FIGS. 11-15, in some cases the spacings are not uniform. Aspects of the present invention are directed to accurately singulating the dies even when the spacings between dies 711 are not uniform. For purposes of illustration, the workpieces shown in FIGS. 11-15 are shown without an encapsulant; however, it will be understood that some or all of the operations described in connection with these Figures may be performed on workpieces with or without an encapsulant.

Figure 11:
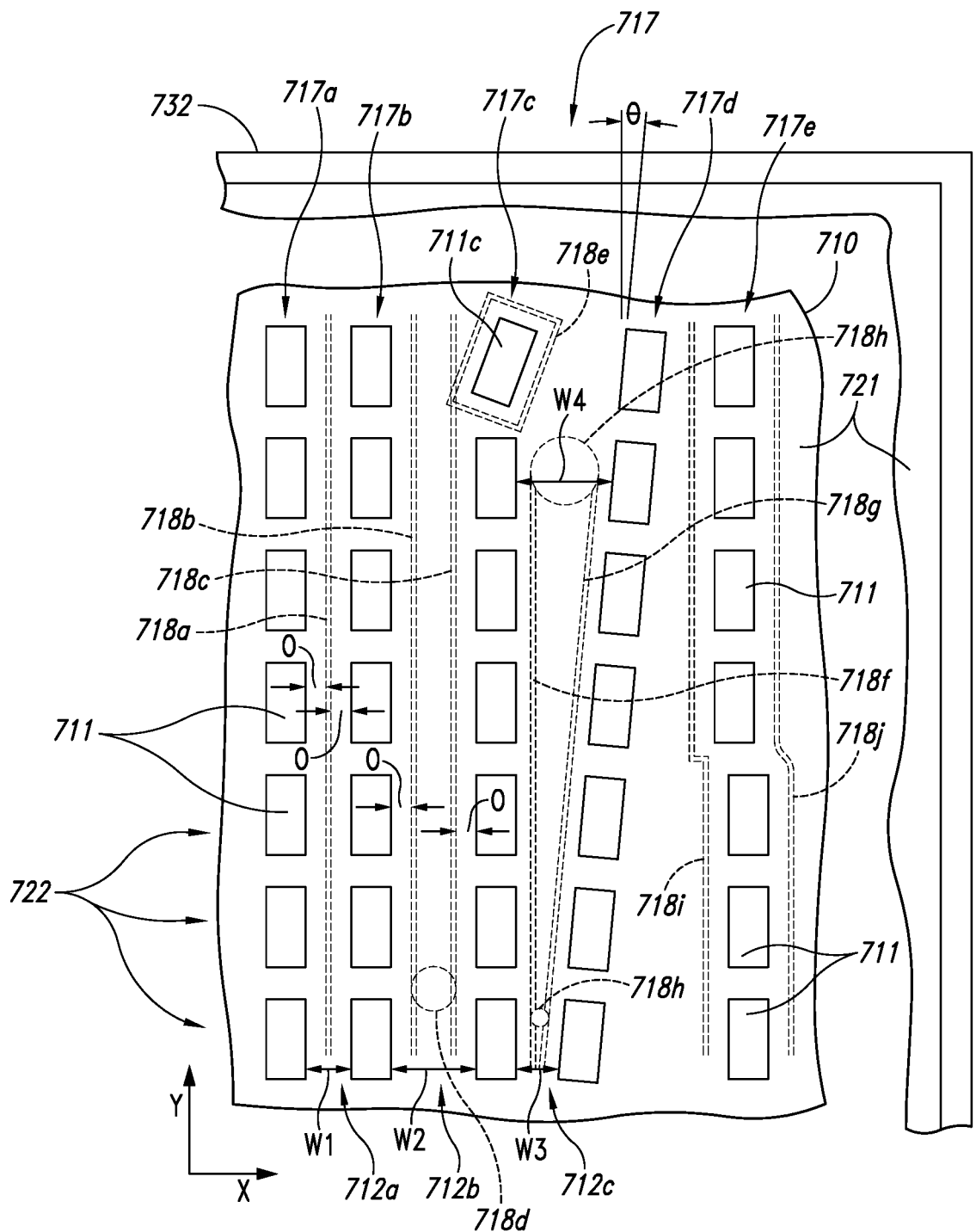
FIG. 11 is a plan view illustrating irregularly spaced dies of an individual semiconductor workpiece, along with representative dicing cuts made in accordance with embodiments of the invention.

FIG. 11 illustrates a portion of a workpiece 710 having dies 711 that are irregularly spaced. At least some of the features of the workpiece 710 may be generally similar to corresponding features of the substrate 602 described above with reference to FIG. 6, though the workpiece 710 has additional features as well. For purposes of completeness, the relevant portions of the workpiece 710 (including some described above with reference to FIG. 6) are described with reference to FIG. 11. For purposes of illustration, several different types of spacing irregularities are shown together on the same workpiece 710 in FIG. 11. It will be understood that in many cases, the same workpiece 710 will not have all these irregularities, while in other cases, the workpieces 710 may have more and/or different irregularities than are shown in FIG. 11.

The dies 711 are arranged in rows 722 and columns 717, including first, second, third, fourth and fifth columns 717a, 717b, 717c, 717d, and 717e respectively. The first and second columns 717a, 717b are separated by a first street 712a, and the second and third columns 717b, 717c are separated by a second street 712b. In the illustrated embodiment, the first street 712a has the "correct" (e.g., specified) street width W1, while the second street 712b has an incorrect (e.g., too large) street width W2. Accordingly, the pitch between the dies can vary from one part of the workpiece to another. When the first column 717a is singulated from the second column 717b, the cutter creates a first kerf 718a. The offset O between the dies 711 in the first column 717a and the edge of the first kerf 718a, and the dies 711 of the second column 717b and the edge of the first kerf 718a are the same and have the correct (e.g., specified) value. However, if the same kerf were to be made between the second and third columns 717b, 717c, the offset between the kerf and the dies 711 of one or both of the columns 717b, 717c would be too large. Accordingly, the dies 711 of the second and third columns 717b, 717c are specifically singulated to account for this irregularity. In a particular embodiment, two kerfs (shown as a second kerf 718b and a third kerf 718c) are made in the same street (e.g., the second street 712b). As a result, the offset O between the dies 711 of the second column 717b and the second kerf 718b is the same as the offset O between dies 711 of the third column 717c and the third kerf 718c.

In another arrangement, a single kerf can be made between the second column 717b and the third column 717c, but it can have a greater width than that of the first kerf 718a. For example, if the kerf is made with a water jet or a laser beam, the diameter of the water jet or the laser beam can be increased to ablate or otherwise remove additional material from between the second and third columns 717b, 717c. FIG. 11 illustrates a fourth (wider) kerf 718d, identified by a circle that represents the diameter of a jet or beam. When traversed along the second street 712b, the jet or beam ablates material to form a single wide kerf 718d. Accordingly, the fourth kerf 718d produces the same desired offset O between its edges and the edges of dies 711 in both the second column 717b and the third column 717c. If the fourth kerf 718d is made with a rotating blade, the blade can have a different width than that of the blade used to make the first kerf 718a, so as to account for the increased spacing between the second and third columns 717b, 717c, relative to the spacing between the first and second columns 717a, 717b.

In other embodiments, the spacing irregularity can produce an angular offset. For example, as shown in FIG. 11, the third row 717c includes a single misaligned die 711c that is angularly offset relative to its neighbors. If the workpiece 710 were cut using standard methods, it is quite likely that the misaligned die 711c would be cut into and therefore not usable. However in a particular embodiment, the individual die 711c can be singulated from the workpiece 710 separately from the other dies 711, as indicated by a fifth kerf 718e. In this particular arrangement, the fifth kerf 718e includes a cut or series of cuts that completely encircle the misaligned die 711c so it can be removed from the workpiece 710. The remaining dies 711 on the workpiece 710 can then be singulated using a succession of vertical cuts followed by horizontal cuts, without cutting into or through the misaligned die 711c.

In still another embodiment, an entire column or portion of a column of dies can be angularly offset from its neighbors. For example, the fourth column 717d of dies 711 is rotated relative to the y axis by a non-zero, non-orthogonal angle θ so that a corresponding third street 712c between the third column 717c and the fourth column 717d has a variable width. Two representative widths are indicated as W3 and W4. One approach to accounting for the variable street width is to provide two kerfs, e.g., a sixth kerf 718f aligned along the third column 717c and a seventh kerf 718g aligned along the fourth column 717d, in a manner generally similar to that described above with reference to the second and third kerfs 718b, 718c, but with the sixth and seventh kerfs 718f, 718g being nonparallel. Another approach is to change the width of a single kerf 718h (represented by circles) as the kerf 718h extends in the y direction. For example, if the kerf 718h is made with a laser beam or water jet, the diameter of the laser beam or water jet can be increased as the kerf 718h progresses in the y direction to account for the increasing width of the third street 712c.

In yet another embodiment, a given row or column of dies may have an irregularity along the length of the row or column. For example, the fifth column 717e of dies 711 can include an offset or "joggle" part-way along the column. Accordingly, an associated process can include cutting a kerf 718i that follows a path deviating from a single straight line along the length of the fifth column 717e. In one aspect of this embodiment, the kerf 718i can be formed from a series of straight line kerfs that account for the offset in the dies 711. In another embodiment, the fifth column 717e can be singulated with a curved kerf 718j to account for the offset in the dies 711.

Figure 12:
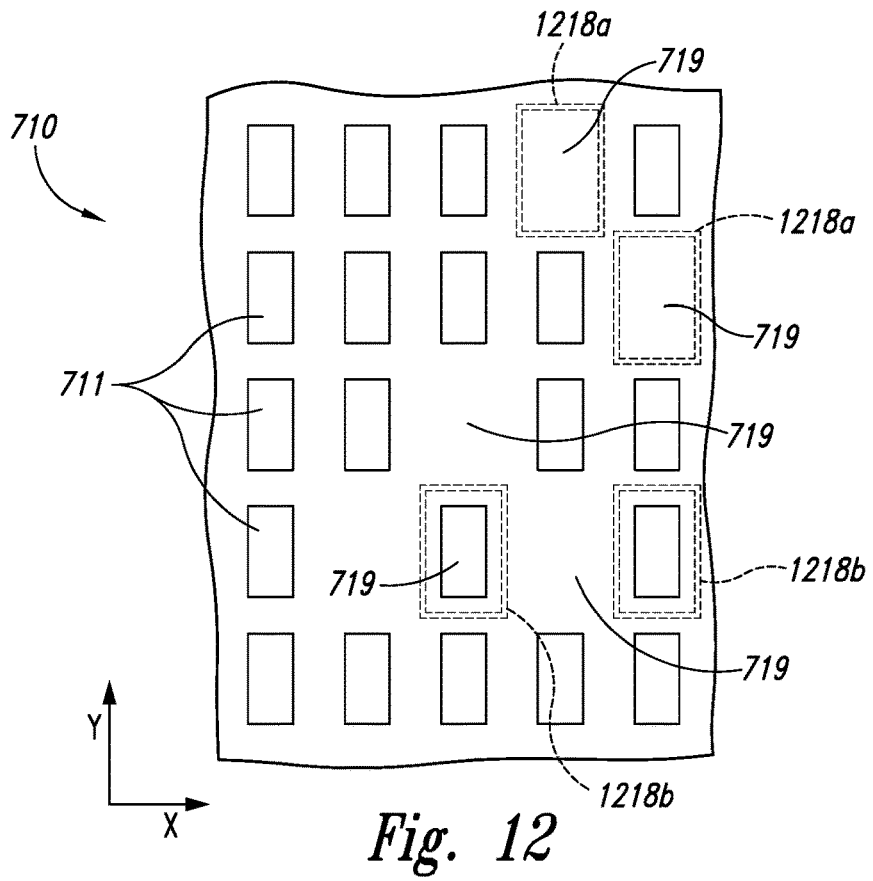
FIG. 12 illustrates a semiconductor workpiece having vacancies, and associated singulation cuts made in accordance with embodiments of the invention.

FIG. 12 is a partially schematic, top plan view of a workpiece 710 having dies 711 that are irregularly spaced as a result of vacancies 719 positioned between at least some of the dies 711. In some cases, it may be desirable to account for the vacancies 719 by cutting them out (as indicated by first kerfs 1218a) and then proceeding with singulating the remaining dies 711 with a series of cuts parallel to the y axis, followed by a series of cuts parallel to the x axis. In other embodiments, it may be desirable to separate individual dies 711 from the workpiece 710, without singulating the vacancies 719. Such an arrangement is illustrated by second kerfs 1218b positioned around individual dies 711. In other still further embodiments, the two foregoing techniques may both be used on a single workpiece, for example a workpiece that has a preponderance of vacancies 719 in one area and a preponderance of dies 711 in another area.

Figure 13:
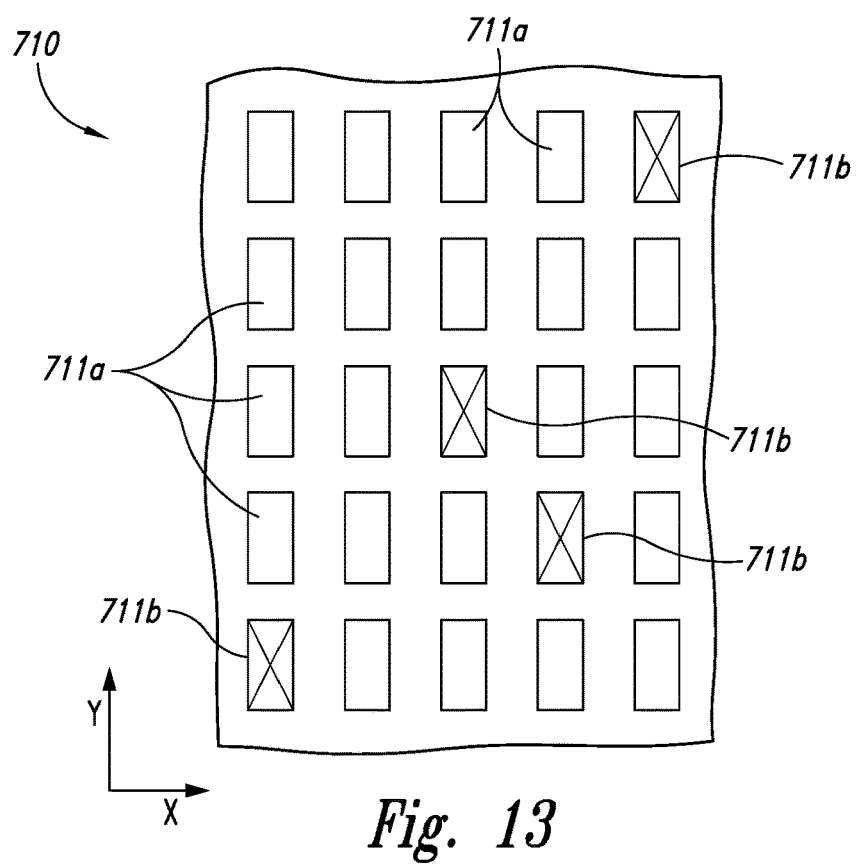
FIG. 13 illustrates a portion of a semiconductor workpiece having defective dies, and associated singulation cuts made in accordance with an embodiment of the invention.

FIG. 13 illustrates a technique used to singulate first dies 711a (e.g., non-defective dies or "known good dies"), that are irregularly spaced from each other by virtue of second dies 711b (e.g., defective, inoperative, or "bad" dies). Depending on the relative number of first dies 711a and second dies 711b, individual first dies 711a may be singulated from the workpiece 710 and the rest of the workpiece 710 discarded, or individual second dies 711b may be singulated from the workpiece 710, and the remaining first dies 711a can be singulated using a series of cuts parallel to the y axis followed by a series of cuts parallel to the x axis. The spacing information on which the singulation process is conducted can in this case include the locations of the first dies 711a and/or the second dies 711b.

FIG. 14A illustrates a portion of a workpiece 710 having dies 711 that are initially uniformly spaced from each other in both the x and y directions. Accordingly, the columns of dies 711 are separated by first streets 712a generally parallel to the y axis and having a width W1, and the rows of dies 711 are separated by series of second streets 712b generally parallel to the x axis and having a width W2. The workpiece 710 can include build-up packages (BUPs) or other arrangements of singulated dies 711 that are then encapsulated. Because the workpiece 710 is carried by a film 721 that can be flexible, resilient, and/or stretchable, the relative positions of neighboring dies 711 may change during the course of a singulation process. For example, as shown in FIG. 14B a first kerf 1418a has been cut along the first street 712a and has caused the two neighboring columns of dies 711 to move apart from each other in the x direction, as indicated by arrow S1. After a second kerf 1418b has been made along one of the second streets 712b, the dies 711 can again move apart, this time in the y direction, as indicated by arrow S2. As a result, the relative spacing between neighboring dies 711 may change during the dicing process. If this change is not accounted for, it can result in subsequent kerfs being misaligned or mispositioned. To account for this shift, the detection device 702 (FIG. 7) can be operated at one or more times during the course of a singulation operation. For example, the detection device 702 can be operated on a continuous basis, or after each street is cut. In a particular embodiment, the information obtained via the detection device 702 can be used real time or nearly real time to update the spacing information for each die 711 before it is cut and/or while it is being cut. In this way, misalignments that may result from individual dies 711 or groups of dies 711 being separated from the workpiece may be accounted for and corrected as the singulation process continues.

FIG. 15 schematically illustrates still another instance in which dies 711 may be irregularly spaced from each other. In one aspect of this arrangement, the workpiece 710 has a crack 721 that causes a first column 717a of dies 711 to be misaligned angularly relative to a second column 717b. As is also shown in FIG. 15, one of the dies 711a straddles the crack 721 and is itself cracked. One or more of any of the foregoing techniques may be used to account for this irregularity. For example, the cracked die 711a may be removed from the rest of the workpiece 710 as single die, and the rest of the dies 711 then singulated. The rest of the dies 711 may be singulated by providing a first kerf 1518a that is parallel to the first column 717a, and a second kerf 1518b that is parallel to the second column 717b. Alternatively, a single kerf having a varying kerf width can be made between the two rows to account for the angular offset between the two rows.

Features of several of the foregoing embodiments can improve the process in accordance with which semiconductor workpieces are singulated. For example, aspects of the foregoing processes allow greater utilization of workpieces having irregularly spaced dies, which otherwise may become damaged and/or may be discarded during the course of processing. This arrangement can improve the efficiency with which the foregoing processes are conducted by improving the yield of dies produced by the processes.

Another feature of at least some of the foregoing embodiments is that they can be used to produce dies having more uniform dimensions because each cut can be made based on information specific to the region that is being cut, rather than being based on information generic to semiconductor workpieces of a particular type. The more uniform dies are more likely to meet quality control specifications, and again result in a greater yield for a given workpiece. This arrangement can also allow the dies to be made smaller because the manufacturer need not account for likely misalignments by oversizing the offset O around the edges of packaged dies.

In many cases, the cutter used to make the foregoing kerfs includes a laser, water jet, or other device that can be programmed to follow any path, including straight line or curved paths. In other embodiments, at least some of the techniques described above can be performed by blades. For example, making multiple kerfs along a single street can be performed with a blade, when the cuts are straight. Making multiple cuts having different kerf widths can be made by changing the thickness of the blade from one cut to another. Making cuts at a non-zero angle θ relative to the x or y axis can be made by rotating the cutter or the workpiece by the proper amount.

Yet a further feature of at least some of the foregoing embodiments is that the workpiece can be singulated without rotating either the cutter or the workpiece. For example, when the cutter includes a water jet or a laser beam, the water jet or laser beam can be moved over the surface of the workpiece to singulate dies having any of a wide variety of orientations by simply positioning the jet or beam, without rotating the workpiece or the cutter. This is unlike existing arrangements in which the workpiece has one orientation while singulating cuts are made between columns of dies, and is then rotated by 90° for cuts made between neighboring rows. By eliminating the need to rotate the cutter or the workpiece, the overall apparatus can be made simpler, as it requires fewer moving parts.

From the foregoing, it will be appreciated that specific embodiments of the invention have been described herein for purposes of illustration, but that various modifications may be made without deviating from the invention. For example, the workpieces and dies may have configurations and/or irregularities other than those shown in the Figures. The workpieces may be supported by devices other than film frames, and may be encapsulated, partially encapsulated, or not encapsulated at all. Certain aspects of the invention described in the context of particular embodiments may be combined or eliminated in other embodiments. For example, any given workpiece may have any one of the irregularities described above, or any combination of such irregularities. Further, while advantages of associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A method for singulating semiconductor dies, comprising:
   detecting spacing information for at least one irregularly spaced die, information for regularly spaced dies, and information for at least one die-sized vacancy positioned between at least some of the dies of an individual semiconductor workpiece, wherein the spacing information includes information about the spacing of a single irregularly spaced die relative to a neighboring die and information about the position of the at least one die-sized vacancy relative to dies adjacent to the at least one die-sized vacancy;
   based at least in part on the spacing information, automatically controlling a process for singulating the dies of the individual semiconductor workpiece, wherein the process includes:
   automatically removing the at least one die-sized vacancy by controlling a path of a cutter as the cutter cuts around the entirety of a perimeter of the at least one die-sized vacancy; automatically singulating the single irregularly spaced die from the individual semiconductor workpiece by controlling a path of the cutter as the cutter cuts around the single irregularly spaced die;
   updating the spacing information as the dies are singulated, wherein the updated spacing information includes information about the spacing of a remaining irregularly spaced die relative to a remaining neighboring die;
   changing a path along which the cutter moves as it singulates the remaining irregularly spaced dies based at least in part on the updated spacing information; and, after no further irregularly spaced dies remain,
   automatically singulating the regularly spaced dies with a series of first straight cuts parallel to an x-axis or y-axis of the individual semiconductor workpiece, followed by a series of second straight cuts perpendicular to the first straight cuts.

2. The method of claim 1 wherein multiple neighboring dies of the workpiece have varying spacing between the dies, and wherein the method further comprises singulating the multiple dies to have at least approximately identical singulated dimensions.

3. The method of claim 2 wherein the dies have an adjacent encapsulant and wherein singulating the multiple dies includes singulating the multiple dies to have at least approximately identical offsets between the edges of the dies and the edges of the adjacent encapsulant.

4. The method of claim 1 wherein detecting spacing information includes detecting an edge of a die, and wherein controlling a process for singulating includes controlling an amount of material between the edge of the die and a singulated edge of the workpiece.

5. The method of claim 1 wherein detecting spacing information includes detecting spacing information via X-rays.

6. The method of claim 1 wherein detecting spacing information includes detecting spacing information via light in the visible spectrum.

7. The method of claim 1 wherein detecting spacing information includes detecting edges of the dies.

8. The method of claim 1 wherein detecting spacing information includes detecting conductive structures of the dies.

9. The method of claim 8 wherein detecting conductive structures includes detecting solder balls.

10. The method of claim 1 wherein detecting spacing information includes detecting fiducials carried by the dies.

11. The method of claim 1 wherein detecting spacing information includes detecting spacing of a first die relative to a neighboring die, and wherein controlling includes controlling a process for singulating the first die, and wherein the method further comprises:
   detecting spacing information for a second die of the semiconductor workpiece after singulating the first die, wherein the spacing information includes information about the spacing of the second die relative to a remaining neighboring die; and
   controlling a process for singulating the second die based at least in part on the spacing information for the second die.

12. The method of claim 1 wherein automatically controlling a process for singulating the dies includes controlling a process for singulating dies from a semiconductor wafer.

13. The method of claim 1 wherein automatically controlling a process for singulating the dies includes controlling a process for singulating dies from a cracked semiconductor workpiece.

14. The method of claim 1 wherein automatically controlling a process for singulating the dies includes controlling a process for singulating encapsulated dies carried by a film frame.

15. The method of claim 14 wherein detecting spacing information includes detecting spacing of a first die relative to a neighboring die, and wherein controlling includes controlling a process for singulating the first die, and wherein the method further comprises:
   detecting spacing information for a second die of the semiconductor workpiece after singulating the first die and after a position of the second die has changed as a result of a film of the film frame moving due to the first die being singulated, wherein the spacing information includes information about the spacing of the second die relative to a remaining neighboring die; and controlling a process for singulating the second die based at least in part on the spacing information for the second die.

16. The method of claim 1 wherein automatically controlling a process for singulating the dies includes controlling a process for singulating the dies without cutting the workpiece with a blade.

17. The method of claim 1 wherein automatically controlling a process for singulating the dies includes controlling a width of a kerf aligned along an edge of a die.

18. The method of claim 17 wherein controlling the width of a kerf includes changing the width of the kerf from one cut to another.

19. The method of claim 17 wherein controlling the width of a kerf includes changing the width of the kerf along a cut.

20. The method of claim 1 further comprising identifying at least one defective die of the semiconductor workpiece and not singulating the at least one defective die.

21. The method of claim 1 wherein automatically controlling a process for singulating the dies includes directing the cutter to follow a path that deviates from a single straight line as it traverses the workpiece.

22. The method of claim 1 wherein automatically controlling a process includes sequentially singulating individual dies from the workpiece.

23. The method of claim 1 wherein automatically controlling a process includes ablating material from between two neighboring dies.

24. The method of claim 1 wherein a street between neighboring encapsulated dies has a varying width along its length, and wherein automatically controlling a process for singulating the dies includes singulating the dies on each side of the street to have at least approximately identical dimensions.

25. The method of claim 24, further comprising making multiple passes along the street with the cutter.

26. The method of claim 24, further comprising changing a width of a cut made by the cutter as the cutter passes along the street.

27. The method of claim 1 wherein a street between neighboring encapsulated dies has a varying width along its length, and wherein automatically controlling a process for singulating the dies includes singulating the dies on the same side of the street to have at least approximately identical dimensions.

28. The method of claim 1 wherein automatically controlling a process for singulating the dies includes automatically controlling a process for singulating a single die from a two-dimensional array of dies.

29. The method of claim 1 wherein an irregularity in the spacing includes an irregularity in the spacing of non-defective dies, wherein the irregularity is due to the presence of defective dies, and wherein the spacing information includes the locations of the defective dies.

30. The method of claim 1 wherein an irregularity in the spacing of the dies is due to the presence of voids between the dies, and wherein the spacing information includes the locations of the voids.

31. A method for singulating semiconductor dies, comprising:
    detecting spacing information for at least one irregularly spaced die relative to dies neighboring the at least one irregularly spaced die, information for regularly spaced dies, and information for a die-sized vacancy positioned between at least some of the dies relative to dies adjacent to the die-sized vacancy, the information related to an individual semiconductor workpiece;
    based at least in part on the spacing information, directing a cutter to:
        cut around the entirety of a perimeter of the die-sized vacancy; and, after cutting around the entirety of the perimeter of the die-sized vacancy,
        deviate from a single straight line path as the cutter traverses the individual semiconductor workpiece by making a first cut along a straight line for a first part of the workpiece and making a second cut deviating from the straight line for a second part of the workpiece;
    removing the die-sized vacancy from the semiconductor workpiece with the cutter;
    singulating a single irregularly spaced die from the individual semiconductor workpiece with the cutter;
    updating the spacing information for remaining irregularly spaced dies relative to remaining dies neighboring the remaining irregularly spaced dies after the die is singulated; and
    changing a cutter path as it singulates the remaining irregularly spaced dies based at least in part on the updated spacing information; and, after no further irregularly spaced dies remain,
    singulating the regularly spaced dies with a series of straight cuts parallel to an x-axis or y-axis of the individual semiconductor workpiece, followed by a series of straight cuts parallel to the other of the x-axis or y-axis.

32. The method of claim 31 wherein the second cut is contiguous with the first cut.

33. The method of claim 31 wherein singulating the die includes singulating a single irregularly spaced die with four successive cuts around only the single die.

* * * * *